[12] United States Patent
Meacham et al.

(10) Patent No.: US 9,172,387 B2
(45) Date of Patent: Oct. 27, 2015

(54) SAMPLING INPUT STAGE WITH MULTIPLE CHANNELS

(71) Applicant: Microchip Technology Incorporated, Chandler, AZ (US)

(72) Inventors: Daniel R. Meacham, Del Mar, CA (US); Andrea Panigada, San Diego, CA (US); David Shih, San Diego, CA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/479,547

(22) Filed: Sep. 8, 2014

(65) Prior Publication Data
US 2015/0070197 A1 Mar. 12, 2015

Related U.S. Application Data

(60) Provisional application No. 61/875,597, filed on Sep. 9, 2013.

(51) Int. Cl.
*H03M 1/12* (2006.01)
*H03M 1/08* (2006.01)
*H03M 1/36* (2006.01)
*G11C 27/02* (2006.01)
*H03M 1/06* (2006.01)

(52) U.S. Cl.
CPC .............. *H03M 1/08* (2013.01); *G11C 27/02* (2013.01); *G11C 27/024* (2013.01); *H03M 1/066* (2013.01); *H03M 1/12* (2013.01); *H03M 1/122* (2013.01); *H03M 1/1205* (2013.01); *H03M 1/36* (2013.01); *H03M 1/1225* (2013.01)

(58) Field of Classification Search
CPC ..... H03M 1/1205; H03M 1/36; H03M 1/122; H03M 1/066; H03M 1/1225; H03M 1/12; H04B 3/32
USPC .......................................... 341/159, 155, 144
See application file for complete search history.

(56) References Cited

U.S. PATENT DOCUMENTS 6,009,178 A * 12/1999 Abel et al. ........................ 381/1
6,809,673 B2 * 10/2004 Scanlan et al. ................ 341/144
8,233,477 B1 * 7/2012 Goergen et al. ............... 370/386

(Continued)

OTHER PUBLICATIONS

International Search Report and Written Opinion, Application No. PCT/US2014/054666, 11 pages, Nov. 26, 2014.

(Continued)

*Primary Examiner* — Brian Young
(74) *Attorney, Agent, or Firm* — Slayden Grubert Beard PLLC

(57) ABSTRACT

An analog input stage has m differential input channels, wherein m>1. The analog input stage is configured to select one of the m differential input channels and provide an output signal. The analog input stage has n identical selection units each having m differential channel inputs and one differential output, wherein n is at least $2^{m-1}$. Each selection unit is operable to be coupled to any of the differential input channels through respective differential multiplexer units, wherein the multiplexor units are driven to select one of the differential input channels and couple the selected differential channel input through a butterfly switch unit with the differential output of the selection unit. The differential output signals of the n selection units are combined whereby unwanted crosstalk from channels other than a selected channel are removed by cancellation.

23 Claims, 8 Drawing Sheets

(56) References Cited

U.S. PATENT DOCUMENTS

| | | | |
|---|---|---|---|
| 8,442,099 B1* | 5/2013 | Sederat | 375/219 |
| 8,773,421 B2* | 7/2014 | Ando et al. | 345/212 |
| 2011/0199245 A1 | 8/2011 | Tsai | 341/122 |

OTHER PUBLICATIONS

Siragusa, Eric et al., "A Digitally Enhanced 1.8-V 15-bit 40-MSample/s CMOS Pipelined ADC," IEEE Journal of Solid-State Circuits, vol. 39, No. 12, 13 pages, Dec. 2004.

Panigada, Andrea et al., "A 130 mW 100 MS/s Pipelined ADC with 60 dB SNDR Enabled by Digital Harmonic Distortion Correction," IEEE Journal of Solid-State Circuits, vol. 44, No. 12, 15 pages, Dec. 11, 2009.

ISLA 214 P 25, Intersil, URL: http://www.intersil.com, 35 pages, Dec. 5, 2012.

B.Y Rakuljic, Nevena et al., "Suppression of Quantization-Induced Convergence Error in Pipelined ADCs with Harmonic Distortion Correction," IEEE Transactions on Circuits and Systems—I: Regular Papers, vol. 60, No. 3, 10 pages, Dec. 21, 2012.

* cited by examiner

SAMPLING INPUT STAGE WITH MULTIPLE CHANNELS

CROSS-REFERENCE To RELATED APPLICATIONS

This application claims the benefit of U.S. Provisional Application No. 61/875,597 filed on Sep. 9, 2013, which is incorporated herein in its entirety.

TECHNICAL FIELD

The present disclosure relates to a sampling input stage with multiple channels, for example useful for an analog-to-digital converters (ADC), in particular to ADC's with multi-channel reconfigurable time-interleaving. However, such an input stage may be used in other ADCs or analog circuits, specifically including those which require high levels of isolation between individual channels.

BACKGROUND

Microcontrollers with integrated ADCs or stand-alone ADCs may comprise a plurality of analog input channels. These individual channels are generally connected to a multiplexer circuit which then couples a selected channel with the ADC proper. A channel is usually selected through a control or configuration register that provides for a plurality of selection bits, for example in a bit field, corresponding to the number of channels. A user can program such a register to select a respective channel by means of the multiplexor circuit or to automatically scan through a selected set of channels.

Crosstalk is a problem in any multiplexor circuit. For many fundamental reasons, if 1 of N inputs is selected and routed to a single output, all of the unselected inputs will still be present at the output to a measurable degree. In the case of an input multiplexor for an ADC converter, the baseline crosstalk is generally around −66 dB for an 80 MHz −1 dBFS input sinusoid, due to capacitive leakage of unselected inputs across the multiplexor (switch) element. This has not been improved by conventional circuit design techniques. Therefore, a need for an improved multiplexer input stage exists.

SUMMARY

According to an embodiment, an analog input stage may have m differential input channels, wherein m>1, wherein the analog input stage is configured to select one of the m differential input channels and provide an output signal, the analog input stage comprising n identical selection units each having m differential channel inputs and one differential output, wherein n is at least $2^{m-1}$; each selection unit is operable to be coupled to any of the differential input channels through respective differential multiplexer units, wherein the multiplexor units are driven to select one of the differential input channels and couple the selected differential channel input through a butterfly switch unit with the differential output of the selection unit; wherein the differential output signals of the n selection units are combined whereby unwanted crosstalk from channels other than a selected channel are removed by cancellation.

According to a further embodiment, the multiplexers in each of the n selection units can be designed to forward a respective differential input signals of a channel in a non-inverting or an inverting fashion when selected. According to a further embodiment, differential input signals of a first channel can be forwarded in a non-inverting fashion, wherein differential input signals of a second channel are forwarded by even multiplexer units in a non-inverting fashion and by odd multiplexor units in an inverting fashion. According to a further embodiment, differential input signals of a third channel can be forwarded by every q and q+1 multiplexor units in a non-inverting fashion and by every q+2 and q+3 multiplexor units in an inverting fashion, wherein q starts with q=1 and is incremented by 3. According to a further embodiment, differential input signals of a fourth channel can be forwarded by every q, q+1, q+2, and q+3 multiplexor units in a non-inverting fashion and by every q+4, q+5, q+6 and q+7 multiplexor units in an inverting fashion, wherein q starts with q=1 and is incremented by 7. According to a further embodiment, each selection unit may comprise a sampling unit connected between the differential multiplexer units and the butterfly switch unit. According to a further embodiment, each sampling unit may comprise a first and sampling capacitor connected between a positive input and output of the sampling unit and a second sampling capacitor connected between a negative input and output of the sampling unit. According to a further embodiment, each sampling unit may comprise a controllable switch for shorting said positive and negative input and first and second grounding switches for grounding said positive and negative output, respectively. According to a further embodiment, the butterfly switch unit can be controlled such that it inverts a differential signal at its input if a selected channel input signal is forwarded in an inverted fashion.

According to another embodiment, an analog-to-digital converter (ADC) may comprise an analog input stage as described above.

According to yet another embodiment, a method for providing a differential input signal selected from a plurality of differential input channels may comprise: providing n identical selection units each having m differential channel inputs and one differential output, wherein n is at least $2^{m-1}$; connecting each differential input channel with a respective channel input of each selection unit in either a non-inverting or inverting fashion according to a connection pattern; selecting an input channel, wherein the signals of a selected input channel are forwarded through a butterfly switch to a differential output of the selection unit; and combining the differential output signals of the n selection units wherein unwanted crosstalk from channels other than a selected channel is removed by cancellation.

According to a further embodiment, the method may further comprise: forwarding differential input signals of a first channel in a non-inverting fashion if selected, and forwarding differential input signals of a second channel within even selection units in a non-inverting fashion and within odd selection units in an inverting fashion if selected. According to a further embodiment, the method may further comprise: forwarding differential input signals of a third channel within every q and q+1 selection unit in a non-inverting fashion and within every q+2 and q+3 selection unit in an inverting fashion, wherein q starts with q=1 and is incremented by 3, and forwarding differential input signals of a fourth channel within every p, p+1, p+2, and p+3 selection unit in a non-inverting fashion and within every p+4, p+5, p+6 and p+7 selection unit in an inverting fashion, wherein q starts with p=1 and is incremented by 7. According to a further embodiment of the method, each selection unit may comprise a sampling unit connected between the differential multiplexers and the butterfly switch unit, wherein each sampling unit comprises a first and sampling capacitor connected between a positive input and output of the sampling unit and a second sampling capacitor connected between a negative input and output of the sampling unit. According to a further embodiment, the method may further comprise: shorting said positive and negative input through a coupling switch and grounding said positive and negative output, respectively through respective grounding switches. According to a further embodiment of the method, controlling the butterfly switch may be performed such that the butterfly switch inverts a differential signal at its input if a selected channel input signal is forwarded in an inverting fashion.

DETAILED DESCRIPTION

The input stage according to various embodiments in this disclosure is useful in any analog system incorporating an input which selects between a plurality of analog channels. It's use in a pipelined ADC as disclosed is merely the current/preferred embodiment. Other applications that use multiplexed input may apply.

According to various embodiments, an ADC input is sampled onto n identical elements which are later combined, wherein n is at least $n=2^{(number\ of\ channels-1)}$. Each channel may provide, for example, a differential input IN_P, IN_N. Thus, in a 4 channel embodiment, for example, at least 8 identical elements are used as will be explained in more detail below.

The embodiment disclosed below will use 4 channels and therefore 16 identical units. Other configuration may use more or less identical elements in accordance with the above mentioned requirements/definition. The multiplexor is also replicated n times and is differentially permuted as it drives each of the sampling elements such that each input is driven with an orthogonal code. The ADC sampling elements are later combined such that the unwanted inputs are canceled out, leaving only the desired input. Each multiplexor unit is strictly differential including parasitic & active elements.

Figure 1:
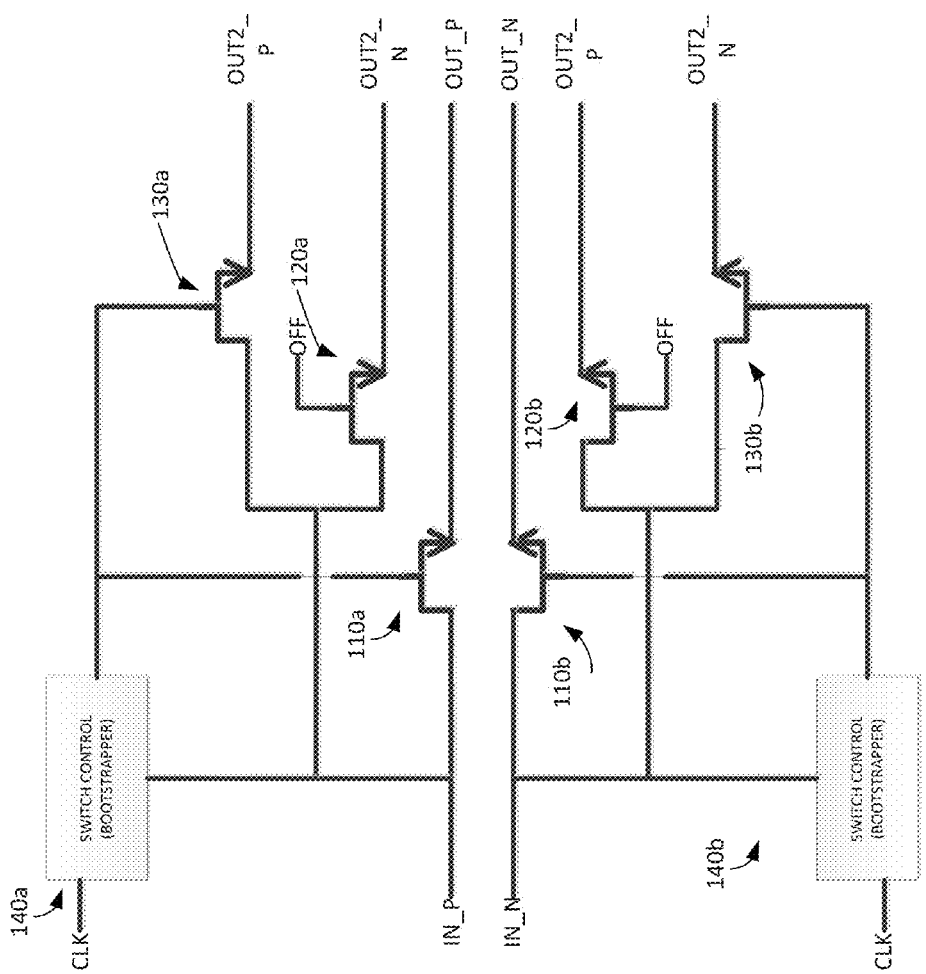
FIG. 1 shows an embodiment of a multiplexer.

The basic multiplexor unit cell according to one embodiment is shown in FIG. 1. In this case, bootstrapped (voltage-boosted) switches are used, but they are not particularly important to the various embodiments. It is critical, however that both sides of a differential signal are sampled in an identical manner. Additionally, if any secondary multiplexor outputs are required (i.e. for a Flash-ADC in the case of a pipelined ADC design) it is critical that parasitic diodes and capacitances are precisely matched by use of dummy devices with identical well ties and well potentials.

As shown in FIG. 1, in the positive branch, input IN_P is coupled in this embodiment with three switches 110a, 120a, and 130a. A bootstrap circuit 140a is provided which receives a clock signal CLK and generates the control signals for switches 110a and 130a. The second switch 120a may be implemented according to some embodiments and is always disabled and exists solely to match parasisitcs for the secondary multiplexor output (OUT2_P). However, other embodiments may not implement switches 120a and 120b. The switch output of the first switch 110a provides the first output signal OUT_P and the switch output of the third switch 130a provides output signal OUT2_P. The switch output of the second switch 120a is connected with the signal OUT2_N from the negative branch. The negative branch for input INN provides the same circuitry with switches 110b, 120b, 130b and bootstrap circuit 140b, wherein the output of switch 120b is connected with signal OUT2_P.

Figure 2:
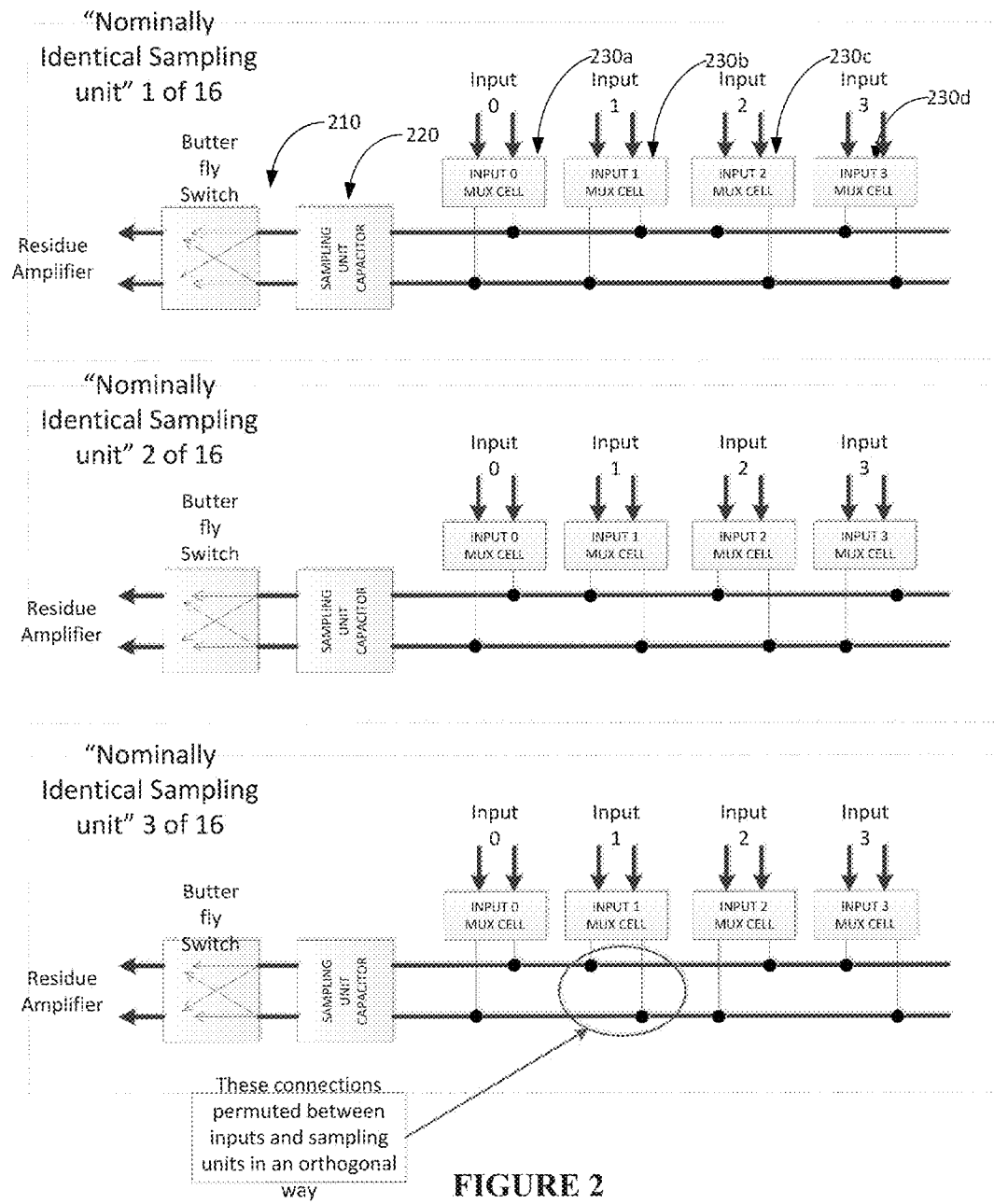
FIG. 2 shows a block diagram showing 3 of 16 sampling units.
Figure 3:
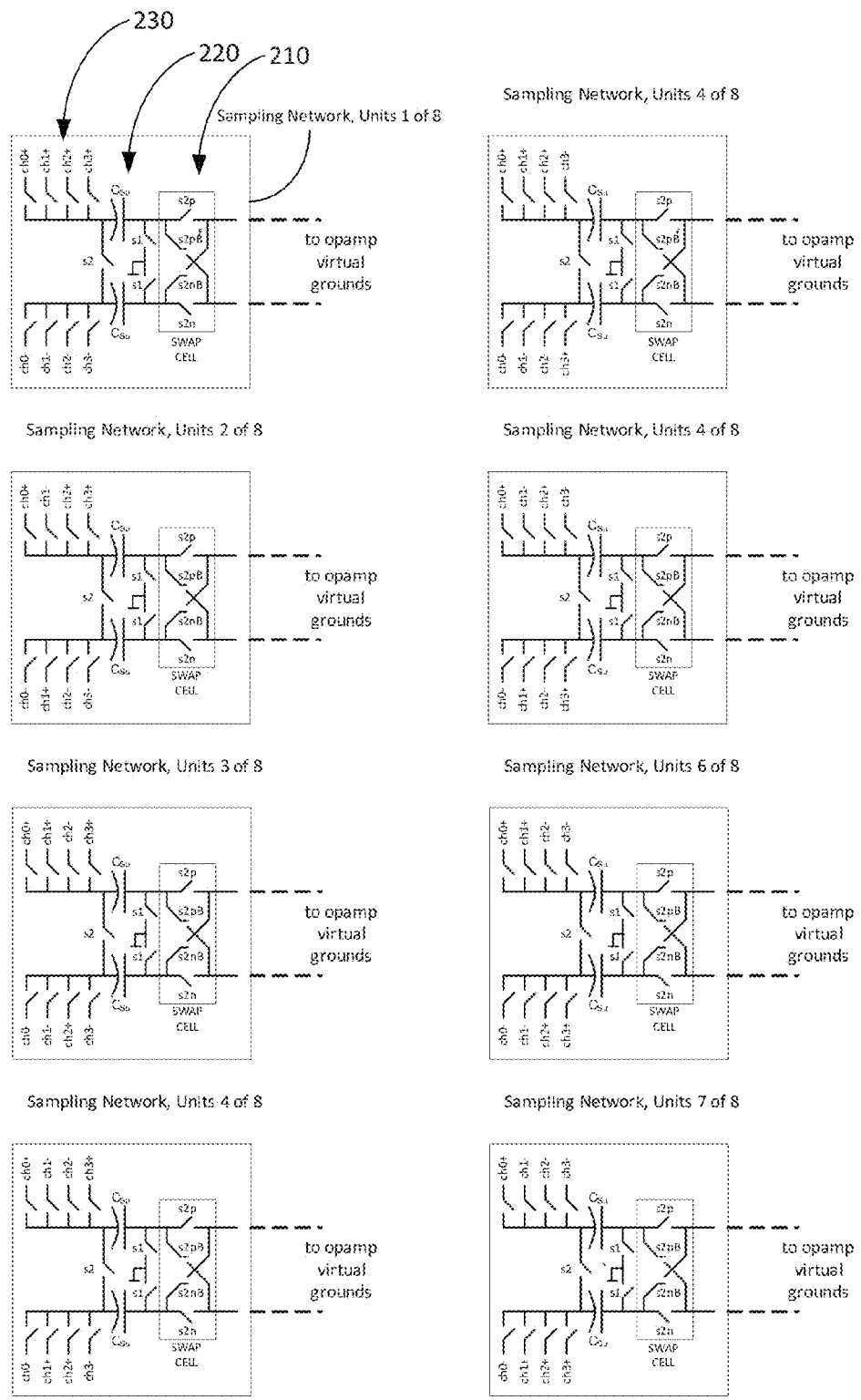
FIG. 3 shows an embodiment of a four channel input stage with eight sampling/selection units.

The crosstalk cancellation technique may involve n=16 nominally identical sampling units for a differential 4 channel system as shown in FIG. 2 and n=8 in the embodiment shown in FIG. 3. The crosstalk cancellation technique reduces the effects of inter-channel cross-talk when multiple inputs are connected to the same sampling capacitor through switches. This technique is very general, but it will be described here in the example of a 4 channel sampling network. FIG. 2 shows that each unit comprises in this embodiment 4 differential input cells 230a, b, c, d that are coupled via an input bus with a sampling unit 220 whose outputs are coupled with a butterfly switch unit 210. However, as mentioned above, the input stage can also be used for any other embodiment providing for an analog input signal selection. Thus, a sampling unit may not be necessary according to various embodiments and could be replaced by connecting the output of the multiplexer unit 230 directly with the input of the butterfly switch unit 210.

The input cells 230a, b, c, d are coupled with the input either in a non-inverting or an inverting fashion according to a connection pattern. As shown, this can be accomplished by connecting the input signal in a non inverting fashion to each multiplexer input and designing the multiplexer to either invert or non-invert the respective input signal by a respective coupling to a signal bus within the selection unit. However, other embodiments may provide that the input signal is connected with the multiplexer inputs in either inverted or non-inverted fashion wherein the multiplexer does not affect the polarity of the signal. Inversion can also be accomplished by permutation of the P and N outputs of a differential signal.

Each of the selection units comprises a different pattern as will be explained in detail below. Thus, cross talk from an otherwise open input channel will be either forwarded to the respective sampling unit 220 non-inverted or inverted according to the respective coupling of each selection unit.

This technique requires the use of at least 8 nominally identical sampling units for 4 channels (in general, for n channels at least $2^{(n-1)}$ units are needed) as shown in FIG. 3 in more detail. FIG. 3 shows the connection of the differential signals for each unit. The chosen pattern connects the inputs of channel 0 in a non-inverting fashion for each unit through switching cells 230. The Swap Cell (Butterfly switch) 210 connects the unit sampling capacitors 220 (or the output signals of the multiplexer directly according to other embodiments) to the virtual ground of the residue amplifier (or processing stage in other embodiments) either directly (through switches s2p and s2n) or inversely (through switches s2pB and s2nB). When channel 0 (ch0) is sampled, all 8 units have their positive input connected to the positive terminal ch0+, and their negative input connected to the negative terminal ch0−, thereby forwarding the differential signal in a non-inverting fashion in each unit (this pattern will be called 11111111). When channel 1 is sampled, the even units have their positive input connected to ch1+, whereas the odd units have their positive input connected to ch1− (pattern 10101010). To compensate for this signal swap, during the amplification phase (or more generally at a later point in the signal path) of the sample from ch1, the butterfly switch is used in the opposite polarity between the even and odd sampling units. Hence, the butterfly switch may be controlled differently in the various selection units depending on the selected channel. The butterfly switch basically "corrects" the signal coupling to the multiplexer 230 such that at its output all selection unit output signals provide are non-inverted for the selected channel.

Assuming the 8 (or 16) units are laid out identically in an array structure and neglecting the effects of mismatch, it can be shown that the input signal from ch0 will tend to couple equally to all the 8 (or 16) unit capacitors. So, during the amplification phase of ch1, the unwanted signal from ch0 coupling to the even units will cancel that coupling to the odd units. Similarly when channel 2 is sampled, the pattern 11001100 is used, and when channel 3 is sampled, the pattern 11110000 is used. Extending the reasoning above, it can be shown that unwanted coupling (crosstalk) between any 2 channels is cancelled out with this technique. Measurement results support this conclusion: the worst case measured cross-talk between channels is <−90 dB with a −1 dBFS 80 MHz input. The residual cross-talk is mostly limited by proximity of the PCB traces: any two channels that are not adjacent on the PCB show <−100 dB cross-talk.

Thus, the input stage is divided into at least $2^{(n-1)}$ equal stages whose outputs are connected in parallel. The channel inputs are connected according to a predefined pattern such that crosstalk from other channels is cancelled out when one channel is selected. This is accomplished by the butterfly swap cell in each input stage that allows inversion of an input from each individual unit. By providing respective orthogonal patterns, while all inputs of a selected channel are correctly forwarded, for example in a non-inverted fashion, the crosstalk from all other channels cancels itself out as half of the input units will forward a non-inverted crosstalk and the other half an inverted cross-talk signal. While the embodiments discussed herein show one possible pattern, a variety of connecting patterns for each channel with each input unit can be chosen to accomplish this.

Figure 4:
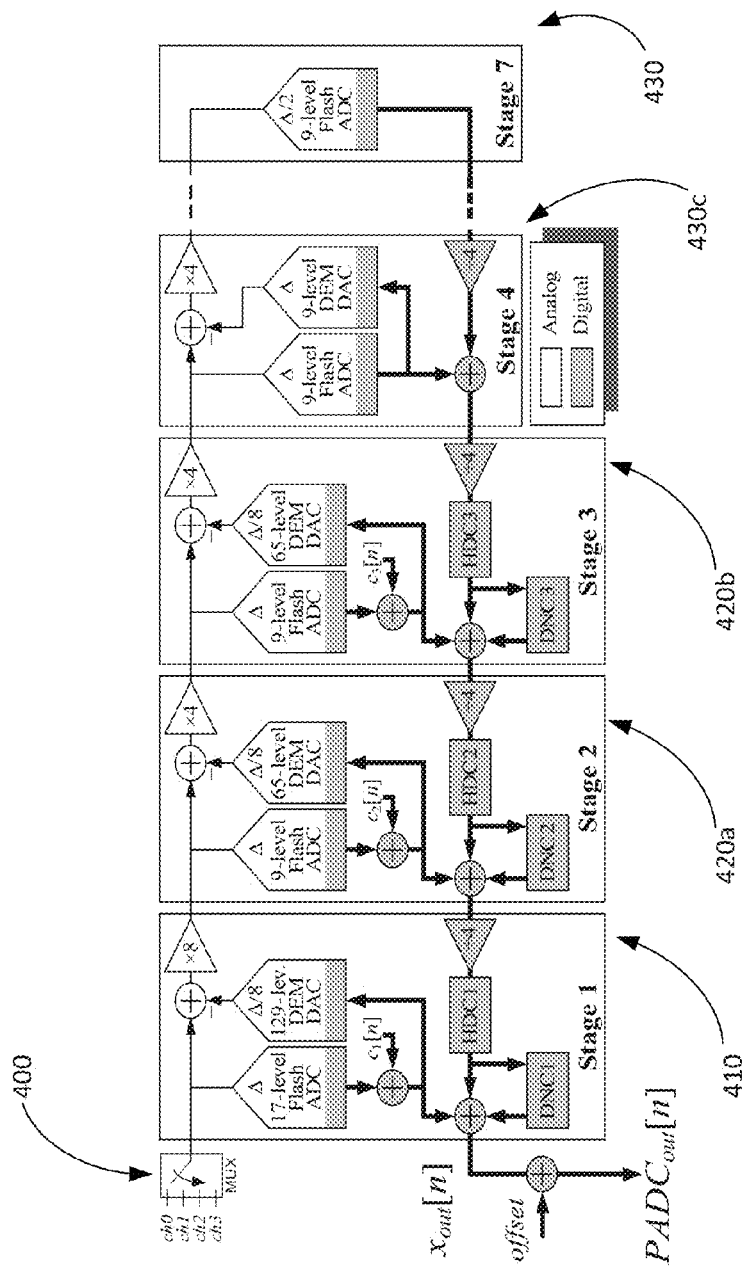
FIG. 4 shows an embodiment of a pipelined ADC.

According to a specific embodiment, FIG. 4 shows a 16-bit Pipelined ADC (PADC) with self-calibration of residue amplifier gain error and nonlinearity, DAC component mismatches, comparator threshold errors, and ADC offsets, and with the new input multiplexor crosstalk cancellation technique that suppresses inter-channel crosstalk as discussed above. Other aspects of such an ADC are discussed in E. Siragusa, I. Galton, "A digitally enhanced 1.8-V 15-bit 40-MSample/s CMOS pipelined ADC", IEEE Journal of Solid-State Circuits, vol. 39, no. 12, pp. 2126-2138, December 2004 which is hereby incorporated by reference in its entirety. As mentioned above, this technique is not restricted to be used with PADC only but can be applied to other analog multiplexers for multiplexing differential signals. This embodiment of an ADC also incorporates harmonic distortion correction (HDC) and the high-speed ADC with time-multiplexed inputs that can be arbitrarily configured. Thus, according to one embodiment, a 385 mW 200 MS/s self-calibrated Pipelined ADC (PADC) with up to 4-channel reconfigurable time-interleaving can be realized that achieves 75 dBFS SNDR (signal to noise and distortion ratio) and 90 dBFS SFDR (spurious free dynamic range).

A simplified block diagram of the PADC core is shown in FIG. 4. It consists of a 4-bit stage 410 followed by 5 3-bit stages 420a, b, c . . . and a final 3-b Flash ADC (FADC) 430. An on-chip digital engine controlled by a state machine performs all the calibrations described below.

Figure 5:
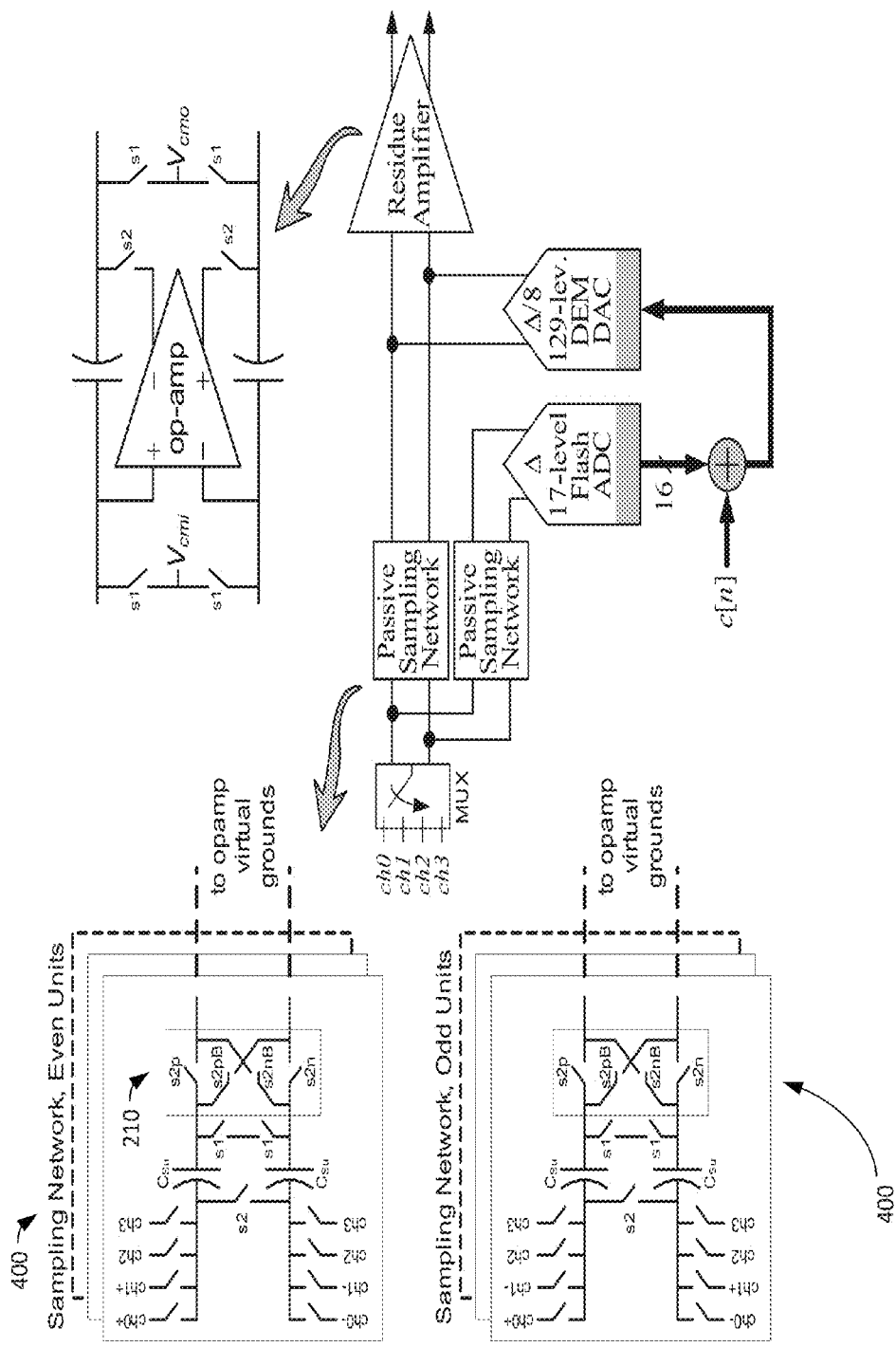
FIG. 5 shows more details of the input section of the pipelined ADC.

The PADC has 4 differential input channels with time-interleaved multichannel sampling (TIMS). Each input is connected to the sampling capacitor via a bootstrapped switch as shown in FIG. 5. Any of the inputs can be enabled in any order: for example, it is possible to enable all the inputs, and sample them in the order 0-2-1-3. The signals are sampled by the same sampling capacitors in a time interleaved manner and converted by the same PADC core. Therefore, in this example, the PADC behaves as four 50 MS/s ADCs in parallel. Similarly if only 2 channels are enabled, the PADC behaves as two 100 MS/s ADCs in parallel. One advantage of the TIMS technique is negligible channel mismatch, because all the signals are converted by the same core analog circuitry. A minor disadvantage for some applications could be that the signals are not synchronously sampled. To address this issue, a digital filter has been included to compensate for the fractional delay introduced by the time interleaved sampling.

A potential disadvantage of TIMS is that cross-talk can be higher than in classical multichannel ADCs, because the input traces must run relatively close to each other to reach the input switches and the common sampling capacitor. Simulations and measurements show that even with careful layout and assuming no component mismatch, the intrinsic parasitic capacitance of the switches limits the cross talk to about −66 dB for a −1 dBFS 80 MHz input signal in conventional multi-channel ADCs. The new input multiplexor crosstalk cancelation technique as discussed above has been implemented in this design according to various embodiments to address this issue.

The technique involves in this embodiment 16 nominally identical sampling units 400 as shown in FIG. 5. However, other embodiments may have less, for example 8 sampling units, or more units. The swap cell 210 in each unit connects the partial sampling capacitor CSu to the virtual ground of the residue amplifier either directly (through switches s2p and s2n) or inversely (through switches s2pB and s2nB) as discussed above. When channel 0 (ch0) is sampled, all 16 units have their positive input connected to the positive terminal ch0+, and their negative input connected to the negative terminal ch0− (this pattern will be called 1111111111111111). During the amplification phase of the sample from ch0, for all 16 units, s2p and s2n are enabled. When channel 1 is sampled, the even units have their positive input connected to ch1+, whereas the odd units have their positive input connected to ch1− (pattern 1010101010101010). To compensate for this signal swap, during the amplification phase of the sample from ch1, s2pB and s2nB are used for the odd units. Assuming the 16 units are laid out identically in an array structure and neglecting the effects of mismatch, it can be shown that the input signal from ch0 will tend to couple equally to all the 16 unit capacitors. So, during the amplification phase of ch1, the unwanted signal from ch0 coupling to the even units will cancel that coupling to the odd units. Similarly when channel 2 is sampled, the pattern 1100110011001100 is used, and when channel 3 is sampled, the pattern 1111000011110000 is used. Extending the reasoning above, it can be shown that coupling between any 2 channels is canceled out with this technique. Measurement results support this conclusion: the worst case measured cross-talk between channels is <−90 dB with a −1 dBFS 80 MHz input. The residual cross-talk is mostly limited by proximity of the PCB traces: any two channels that are not adjacent on the PCB show <−100 dB cross-talk.

The overall performance is in line with the state of the art, when compared with other single channel devices. A typical die micrograph is shown in FIG. 8.

Figure 7:
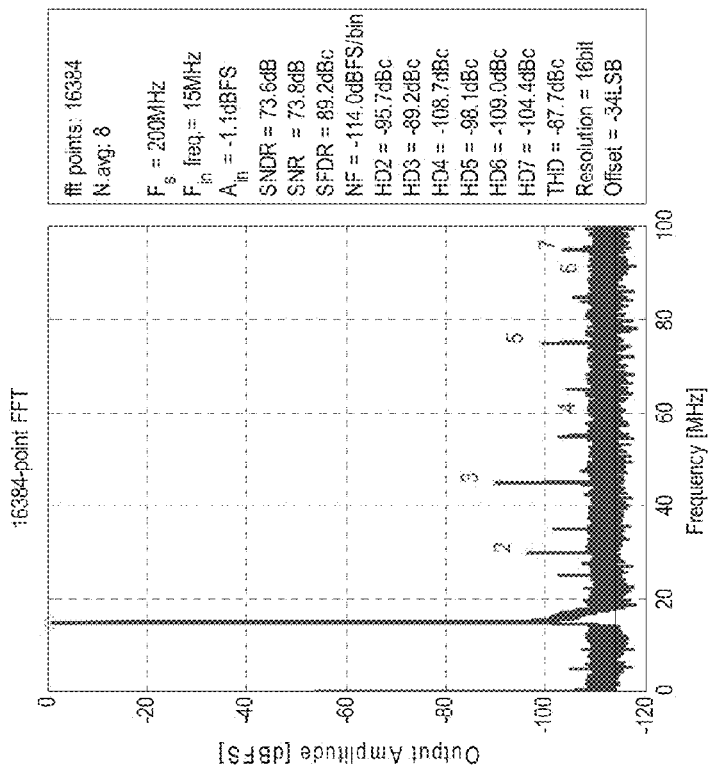
FIG. 7 shows an FFT of the digital PADC output
Figure 6:
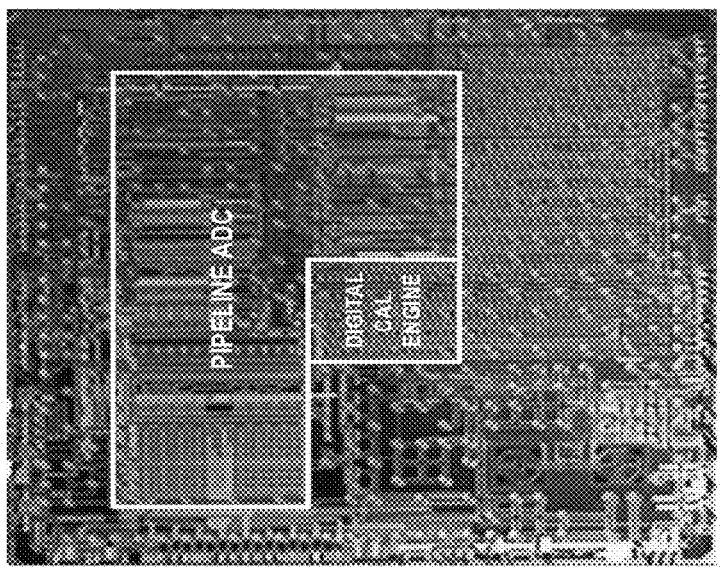
FIG. 6 shows a die micrograph.
Figure 8A:
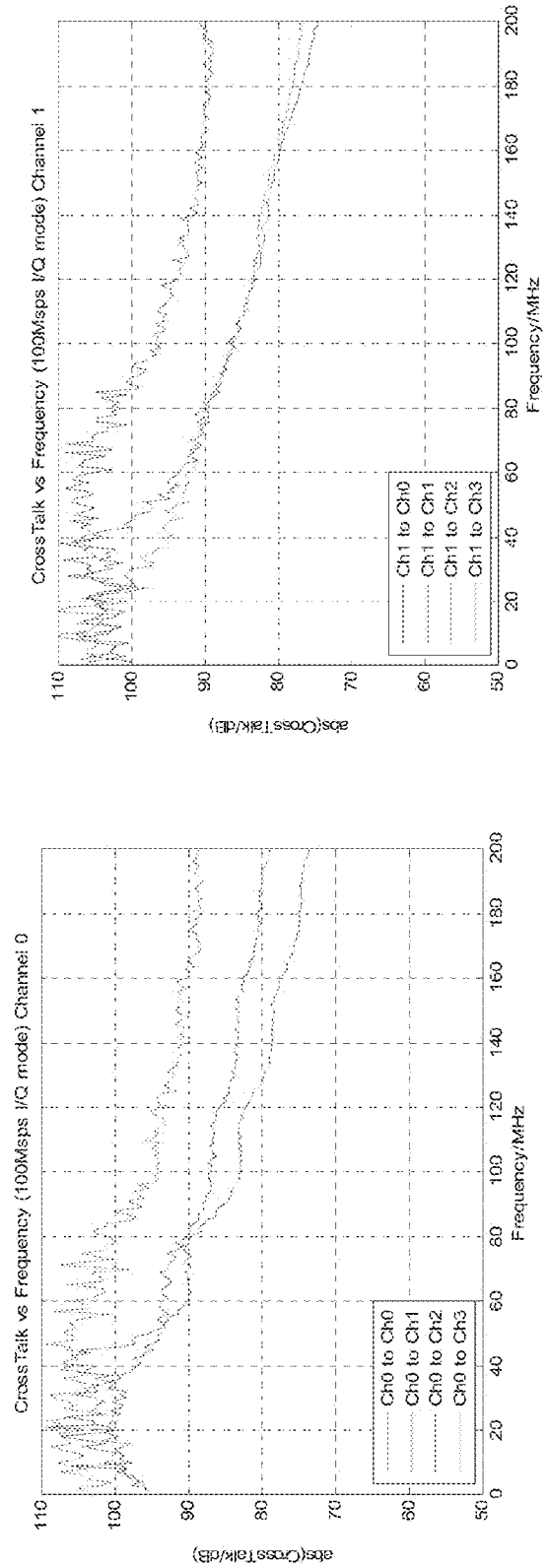
FIGS. 8a-8b show cross-talk between the 4 input channels according to a specific embodiment.
Figure 8B:
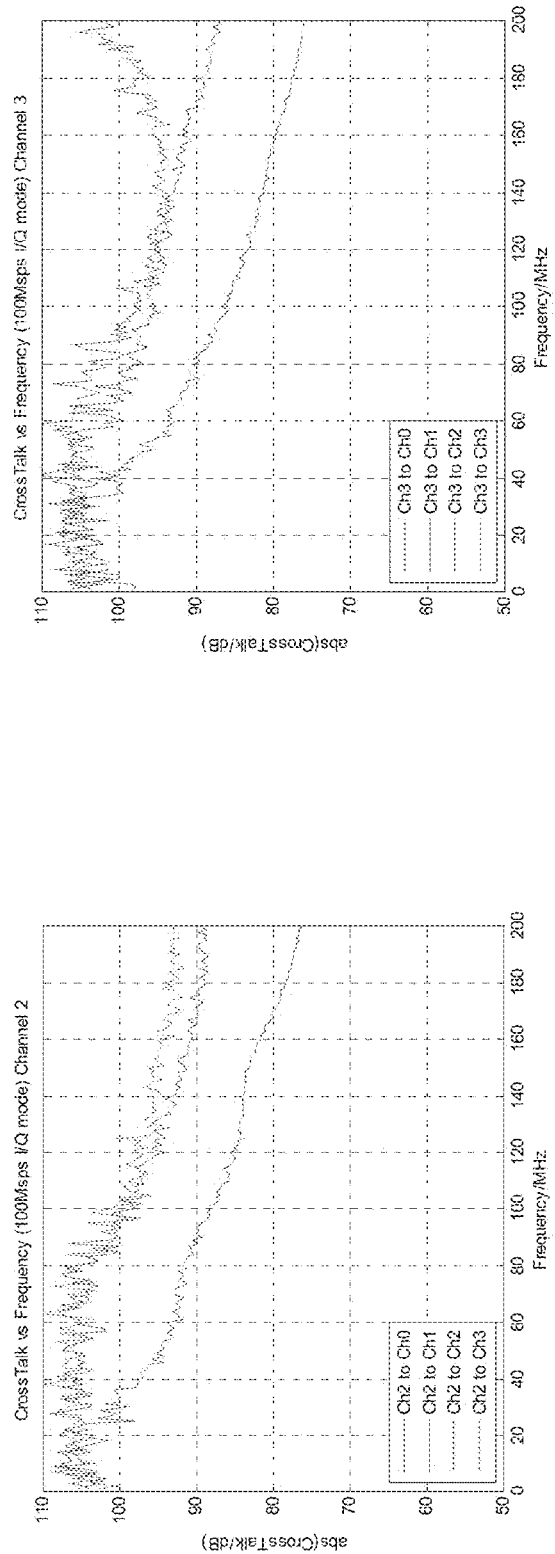

FIG. 7 shows an FFT of the digital PADC output, for a 15 MHz, −1 dBFS input sine wave. FIGS. 8a and 8b show cross-talk between the 4 input channels. The ADC core runs at 200 MSps, in dual channel mode (worst case for Cross Talk).

What is claimed is:

1. An analog input stage having m differential input channels, wherein m>1, wherein the analog input stage is configured to select one of the m differential input channels and provide an output signal, the analog input stage comprising;
   n identical selection units each having m differential channel inputs and one differential output, wherein n is at least $2^{m-1}$:
   each selection unit is operable to be coupled to any of the differential input channels through respective differential multiplexer units, wherein the multiplexor units are driven to select one of the differential input channels and couple the selected differential channel input through a butterfly switch unit with the differential output of the selection unit:
   wherein the differential output signals of the n selection units are combined whereby unwanted crosstalk from channels other than a selected channel are removed by cancellation, wherein the multiplexers in each of the n selection units are designed to forward a respective differential input signals of a channel in a non-inverting or an inverting fashion when selected.

2. The analog input stage according to claim 1, wherein differential input signals of a first channel are forwarded in a non-inverting fashion, wherein differential input signals of a second channel are forwarded by even multiplexer units in a non-inverting fashion and by odd multiplexor units in an inverting fashion.

3. The analog input stage according to claim 2, wherein differential input signals of a third channel are forwarded by every q and q+1 multiplexor units in a non-inverting fashion and by every q+2 and q+3 multiplexor units in an inverting fashion, wherein q starts with q=1 and is incremented by 3.

4. The analog input stage according to claim 3, wherein differential input signals of a fourth channel are forwarded by every q, q+1, q+2, and q+3 multiplexor units in a non-inverting fashion and by every q+4, q+5, q+6 and q+7 multiplexor units in an inverting fashion, wherein q starts with q=1 and is incremented by 7.

5. An analog input stage having m differential input channels, wherein m>1, wherein the analog input stage is configured to select one of the m differential input channels and provide an output signal, the analog input stage comprising:
   n identical selection units each having m differential channel inputs and one differential output, wherein n is at least $2^{m-1}$:
   each selection unit is operable to be coupled to any of the differential input channels through respective differential multiplexer units, wherein the multiplexor units are driven to select one of the differential input channels and couple the selected differential channel input through a butterfly switch unit with the differential output of the selection unit:
   wherein the differenaal output signals of the selection units are combined whereby unwanted crosstalk from channels other than a selected channel are removed by cancellation, wherein each selection unit comprises a sampling unit connected between the differential multiplexer units and the butterfly switch unit.

6. The analog input stage according to claim 5, wherein each sampling unit comprises a first and sampling capacitor connected between a positive input and output of the sampling unit and a second sampling capacitor connected between a negative input and output of the sampling unit.

7. The analog input stage according to claim 6, wherein each sampling unit comprises a controllable switch for shorting said positive and negative input and first and second grounding switches for grounding said positive and negative output, respectively.

8. The analog input stage according to claim 1, wherein the butterfly switch unit is controlled such that it inverts a differential signal at its input if a selected channel input signal is forwarded in an inverted fashion.

9. A method for providing a differential input signal selected from a plurality of differential input channels, the method comprising:
   providing n identical selection units each having m differential channel inputs and one differential output, wherein n is at least $2^{m-1}$;
   connecting each differential input channel with a respective channel input of each selection unit in either a non-inverting or inverting fashion according to a connection pattern;
   selecting an input channel, wherein the signals of a selected input channel are forwarded through a butterfly switch to a differential output of the selection unit; and
   combining the differential output signals of the n selection units wherein unwanted crosstalk from channels other than a selected channel is removed by cancellation.

10. The method according to claim 9, further comprising:
    forwarding differential input signals of a first channel in a non-inverting fashion if selected, and
    forwarding differential input signals of a second channel within even selection units in a non-inverting fashion and within odd selection units in an inverting fashion if selected.

11. The method according to claim 10, further comprising:
    forwarding differential input signals of a third channel within every q and q+1 selection unit in a non-inverting fashion and within every q+2 and q+3 selection unit in an inverting fashion, wherein q starts with q=1 and is incremented by 3, and
    forwarding differential input signals of a fourth channel within every p, p+1, p+2, and p+3 selection unit in a non-inverting fashion and within every p+4, p+5, p+6 and p+7 selection unit in an inverting fashion, wherein q starts with p=1 and is incremented by 7.

12. The method according to claim 11, wherein each selection unit comprises a sampling unit connected between the differential multiplexers and the butterfly switch unit, wherein each sampling unit comprises a first and sampling capacitor connected between a positive input and output of the sampling unit and a second sampling capacitor connected between a negative input and output of the sampling unit.

13. The method according to claim 12, further comprising shorting said positive and negative input through a coupling switch and grounding said positive and negative output, respectively through respective grounding switches.

14. The method according to claim 9, wherein controlling the butterfly switch such that the butterfly switch inverts a differential signal at its input if a selected channel input signal is forwarded in an inverting fashion.

15. An analog-to-digital converter (ADC) comprising an analog input stage having m differential input channels, wherein m>1, wherein the analog input stage is configured to select one of the m differential input channels and provide an output signal, the analog input stage comprising:

n identical selection units each having m differential channel inputs and one differential output, wherein n is at least $2^{m-1}$;

each selection unit is operable to be coupled to any of the differential input channels through respective differential multiplexer units, wherein the multiplexor units are driven to select one of the differential input channels and couple the selected differential channel input through a butterfly switch unit with the differential output of the selection unit;

wherein the differential output signals of the n selection units are combined and is connected with an input of the ADC, whereby unwanted crosstalk from channels other than a selected channel are removed by cancellation.

16. The ADC according to claim 15, wherein the multiplexers in each of the n selection units are designed to forward a respective differential input signals of a channel in a non-inverting or an inverting fashion when selected.

17. The ADC according to claim 16, wherein differential input signals of a first channel are forwarded in a non-inverting fashion, wherein differential input signals of a second channel are forwarded by even multiplexer units in a non-inverting fashion and by odd multiplexor units in an inverting fashion.

18. The ADC according to claim 17, wherein differential input signals of a third channel are forwarded by every q and q+1 multiplexor units in a non-inverting fashion and by every q+2 and q+3 multiplexor units in an inverting fashion, wherein q starts with q=1 and is incremented by 3.

19. The ADC according to claim 18, wherein differential input signals of a fourth channel are forwarded by every q, q+1, q+2, and q+3 multiplexor units in a non-inverting fashion and by every q+4, q+5, q+6 and q+7 multiplexor units in an inverting fashion, wherein q starts with q=1 and is incremented by 7.

20. The ADC according to claim 15, wherein each selection unit comprises a sampling unit connected between the differential multiplexer units and the butterfly switch unit.

21. The ADC according to claim 20, wherein each sampling unit comprises a first and sampling capacitor connected between a positive input and output of the sampling unit and a second sampling capacitor connected between a negative input and output of the sampling unit.

22. The ADC according to claim 21, wherein each sampling unit comprises a controllable switch for shorting said positive and negative input and first and second grounding switches for grounding said positive and negative output, respectively.

23. The ADC according to claim 16, wherein the butterfly switch unit is controlled such that it inverts a differential signal at its input if a selected channel input signal is forwarded in an inverted fashion.

* * * * *

UNITED STATES PATENT AND TRADEMARK OFFICE
CERTIFICATE OF CORRECTION

PATENT NO.         : 9,172,387 B2
APPLICATION NO.    : 14/479547
DATED              : October 27, 2015
INVENTOR(S)        : Daniel R. Meacham et al.

It is certified that error appears in the above-identified patent and that said Letters Patent is hereby corrected as shown below:

In the Claims,

Column 7,
Claim 5, line 59, "... wherein the differenaal output signals of the selection units..." ---Change to--- "...wherein the differential output signals of the selection units..."

Signed and Sealed this
Twenty-second Day of March, 2016

Michelle K. Lee
*Director of the United States Patent and Trademark Office*